United States Patent
Aley et al.

(10) Patent No.: US 10,107,880 B2
(45) Date of Patent: Oct. 23, 2018

(54) METHOD AND APPARATUS FOR SHUTTING DOWN A SUPERCONDUCTING MAGNET OF A MAGNETIC RESONANCE DEVICE

(71) Applicant: Siemens Healthcare GmbH, Erlangen (DE)

(72) Inventors: Nicholas Aley, Erlangen (DE); Stephan Biber, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 15/850,704

(22) Filed: Dec. 21, 2017

(65) Prior Publication Data
US 2018/0172787 A1    Jun. 21, 2018

(30) Foreign Application Priority Data

Dec. 21, 2016    (DE) .................. 10 2016 225 700

(51) Int. Cl.
*G01R 33/3815*    (2006.01)

(52) U.S. Cl.
CPC .................. *G01R 33/3815* (2013.01)

(58) Field of Classification Search
CPC .................. G01R 33/3815; H01F 6/006
See application file for complete search history.

(56) References Cited

U.S. PATENT DOCUMENTS

| 6,097,187 A * | 8/2000 | Srivastava ......... G01R 33/3815 324/319 |
| 8,027,139 B2 | 9/2011 | Beier |
| 2009/0002902 A1 | 1/2009 | Bittner |
| 2012/0182012 A1 | 7/2012 | Lvovsky et al. |
| 2015/0255977 A1 | 9/2015 | Jonas et al. |
| 2015/0346296 A1 | 12/2015 | Biber et al. |
| 2017/0261574 A1* | 9/2017 | Stainsby ............ G01R 33/3804 |
| 2017/0328969 A1* | 11/2017 | Biber ................... G01R 33/546 |
| 2017/0358386 A1* | 12/2017 | Armstrong ............ H01F 6/006 |

FOREIGN PATENT DOCUMENTS

DE    20 2016 006 754 U1    12/2016

\* cited by examiner

*Primary Examiner* — Rishi Patel
(74) *Attorney, Agent, or Firm* — Schiff Hardin LLP

(57) ABSTRACT

In a method and system for shutting down a superconducting magnet of a magnetic resonance apparatus using a monitoring processor and an energy store, the monitoring processor determines stored energy stored in the energy store at a first point-in-time, and determines a ramp energy required for shutting down, and determines a second point-in-time based on the stored energy and the ramp energy. At the second point-in-time, shutting down of the superconducting magnet is begun.

12 Claims, 2 Drawing Sheets

METHOD AND APPARATUS FOR SHUTTING DOWN A SUPERCONDUCTING MAGNET OF A MAGNETIC RESONANCE DEVICE

BACKGROUND OF THE INVENTION

Field of the Invention

The invention concerns a method, a system, a magnetic resonance apparatus, and an electronically readable data carrier for shutting down a superconducting magnet of a magnetic resonance apparatus.

Description of the Prior Art

In a magnetic resonance apparatus the examination object, for example a patient, is conventionally exposed to a relatively high main magnetic field, for example of 1.5 or 3 tesla produced by a superconducting magnet. Superconducting magnets require a very cold environment, such as a cryotank filled with a cooling medium, typically liquid helium. Superconducting magnets have practically no resistance, so that no energy is required for maintaining a flow of current in a superconducting magnetic coil, and thus also for maintaining the magnetic field generated by the magnetic coil.

A quench of a superconducting magnet occurs when a part of the superconducting magnet loses its superconducting property and becomes normal-conducting. Energy stored in the magnetic field generated by the superconducting magnet is thereby converted into thermal energy, and the magnetic coil and/or the cryotank thus can be damaged. In addition, the cooling medium typically evaporates, and this can mean loss of the helium. A quench should therefore be avoided.

A supply of energy to the superconducting magnet is typically required in order to maintain the superconducting properties and so in order to avoid a quench. A continuous energy supply to a magnetic resonance apparatus accordingly should be ensured. If power supply to a magnetic resonance apparatus is interrupted, techniques are know that cause the magnetic field generated by the superconducting magnet to be shut down in a controlled manner, so that a quench can be avoided.

DE 102013208631 B3 describes a cooling system for cooling a superconducting magnetic coil that continues to ensure cooling of the superconducting main magnetic coil in the event of a disruption in the cooling system. DE 102005062581 B3 describes a circuit for quench protection for a superconducting magnet of a magnetic resonance apparatus.

SUMMARY OF THE INVENTION

An object of the invention is to provide a reliable method for shutting down a superconducting magnet of a magnetic resonance apparatus.

The inventive method for shutting down a superconducting magnet of a magnetic resonance apparatus makes use of a monitoring processor and an energy store, with the following steps.

Stored energy stored in the energy store at a first point-in-time is determined in the monitoring processor. A ramp energy required for shutting down the superconducting magnet is determined in the monitoring processor. A second point-in-time is determined in the monitoring processor based on the stored energy and the ramp energy, and a shutdown controller begins shutting down the superconducting magnet at the second point-in-time.

The shutdown controller may be the monitoring processor, or another control device.

The energy store is a unit in which energy can be stored. The energy stored in the energy store is preferably present in the energy store independently and/or autonomously of a further external energy source. Initially, the energy stored in the energy store can be supplied to the energy store by a further external energy source. The energy stored in the energy store is used in the event of failure of a continuous energy supply to the superconducting magnet, preferably only in this case. The energy stored in the energy store is typically used in the case of failure of a continuous energy supply to the superconducting magnet, by the stored energy being used to supply the superconducting magnet with energy over a particular period and/or to avoid a quench of the superconducting magnet by allowing a controlled shutdown. A controlled shutdown of the superconducting magnet means a quench and/or damage to the superconducting magnet and/or uncontrolled loss of the cooling medium is avoided.

Independently of shutting down with the monitoring processor and the energy store in accordance with the invention, a superconducting magnet is typically connected to a conventional magnet monitoring processor that monitors, for example, a temperature inside the cryotank. The magnet monitoring processor can be modified so as to serve as the inventive monitoring processor, the monitoring processor designed to carry out the inventive method for shutting down a superconducting magnet of a magnetic resonance apparatus. Alternatively and/or additionally, the inventive monitoring processor can be separate from and/or independent of the conventional magnet monitoring processor. The inventive monitoring processor is connected to the superconducting magnet and the energy store, so that the joint monitoring can be carried out by the monitoring processor. The monitoring processor is designed to determine the energy incorporated by the energy store. The monitoring processor, for example, can give a signal or a warning and/or bring about charging of the energy store and/or an exchange of the energy store if the energy incorporated by the energy store falls below a threshold value. The monitoring processor therefore ensures that the energy store has a minimum quantity of energy.

Shutting down the superconducting magnet causes the magnetic field generated by the superconducting magnet to be dismantled. Shutting down occurs in a controlled manner, so that the superconducting magnet and/or the magnetic resonance apparatus is/are not damaged and/or there is no uncontrolled loss of cooling medium.

According to the inventive method, the stored energy is determined at the first point-in-time. The stored energy is the energy stored in the energy store at the first point-in-time. The monitoring processor is connected to the energy store so as to be able to determine the stored energy. The ramp energy is determined using the monitoring processor. The ramp energy typically depends on the superconducting magnet and/or the magnetic resonance apparatus. The ramp energy can be independent of time, in particular independent of the first point-in-time. The ramp energy required for the superconducting magnet used in the inventive method is preferably stored as a parameter in a memory, with which the monitoring processor is connected, and/or stored in the monitoring processor. Alternatively and/or additionally, the monitoring processor can calculate the ramp energy. The ramp energy is the energy required to shut down the superconducting magnet safely and in a controlled manner and/or to initiate shutting down of the superconducting magnet. A supply of energy is typically necessary only for the beginning of shutting down of the superconducting magnet, whereas no further supply of energy is required during shutting down of the superconducting magnet. If the ramp energy indicates only the energy that is required for initiating shutting down of the superconducting magnet, the ramp energy can also be called the ramp-initialization energy. The ramp initialization energy is in this case synonymous with the ramp energy. Determination of the ramp energy is preferably time independent of determination of the stored energy.

The second point-in-time is determined by taking into account the ramp energy and the stored energy. The second point-in-time is chosen such that when shutting down of the superconducting magnet begins at the second point-in-time, it being the shutdown of the superconducting magnet occurs in a controlled manner, particularly in the absence of a further energy source. The second point-in-time is chosen such that, at the second point-in-time, the ramp energy typically imperatively required for controlled shutting down of the superconducting magnet is incorporated by the energy store. At the second point-in-time, the energy store provides the ramp energy so that controlled shutting down of the superconducting magnet can be initiated. The second point-in-time is preferably determined at the first point-in-time and/or immediately after conclusion of determination of the stored energy and after conclusion of determination of the ramp energy. The period between the first point-in-time and the second point-in-time is determined as being a time duration in which the superconducting magnet of the magnetic resonance apparatus can be supplied with power by the stored energy. The period is typically chosen such that, at the second point-in-time, the energy store incorporates at least the ramp energy. At the second point-in-time, the energy store can still have further energy stored therein, in addition to the ramp energy. The further energy can be used as a buffer in order to guarantee controlled shutting down of the superconducting magnet. For example, the quantity of energy stored in the energy store is at least equal to the ramp energy.

The advantage of the inventive method is that the superconducting magnet can be shut down in a controlled manner and a quench can thereby be avoided. The quantity of energy stored in the energy store can be variable. For example, the energy incorporated by the energy store can become lower over the course of time, and/or, as a result of external circumstances, can be lower than envisaged, in particular lower than the maximum energy incorporated by the energy store. If, for example during a short period, it is necessary to shut down the superconducting magnet twice, it may be that the energy store incorporates only a very small quantity of energy.

By determining the stored energy at the first point-in-time, the current energy incorporated by the energy store can be determined and taken into account in the method, in particular for shutting down the superconducting magnet. Variations in the stored energy thus can be taken into account, and controlled shutting down of the superconducting magnet can be enabled with reduced stored energy. The inventive method accordingly enables particularly reliable shutting down of the superconducting magnet.

In addition, the inventive method enables maintenance of the magnetic field generated by the superconducting magnet between the first point-in-time and the second point-in-time, so that between the first point-in-time and the second point-in-time there is the possibility of preventing shutting down the superconducting magnet. Shutting down the superconducting magnet can be prevented, for example, by the superconducting magnet being connected to a further energy source and/or the energy store being exchanged. This is particularly advantageous since shutting down and/or powering up of the superconducting magnet is typically time-intensive and/or cost-intensive.

Furthermore, a quench of the superconducting magnet can be particularly effectively prevented by the inventive method. This is advantageous with superconducting magnets that are cooled with a particularly small quantity of cooling medium, for example with less than 100 l helium, since superconducting magnets of this kind become particularly warm after a quench, so that the duration after the quench required for cooling until the superconducting temperature is reached, is particularly long. Only after reaching the superconducting temperature can the superconducting magnet be started again, so that the superconducting magnet generates a magnetic field.

The inventive method is typically carried out when the magnetic resonance apparatus is not in clinical operation, in particular when a patient is not being examined with the magnetic resonance apparatus. If the magnetic resonance apparatus is in clinical operation at the first point-in-time and an examination of a patient is being carried out with the magnetic resonance apparatus, this examination is typically aborted at the first point-in-time.

In an embodiment of the method, it is determined before the beginning of the shutdown whether the superconducting magnet is connected to a further energy source and the method is continued only in the absence of a further energy source being connected.

The further energy source can be, for example, the public power at the site of the magnetic resonance apparatus and/or a generator for local power supply. The further energy source is preferably characterized by normally (i.e. for more than 90%, preferably for more than 95% of the time), it is the further energy source that supplies the magnetic resonance apparatus and/or the superconducting magnet of the magnetic resonance apparatus with energy. The further energy source typically has such a large quantity of energy and/or is connected to a unit that generates energy, so that the magnetic resonance apparatus can be operated by the further energy source in clinical operation and, in particular, for generating image data of patients. The further energy source can alternatively be a second energy store that supplies the magnetic resonance apparatus with energy, for example in the event of failure of the local power supply. The further energy source is characterized by being able to continuously supply the magnetic resonance apparatus and/or the superconducting magnet with energy.

The absence of a further energy source is preferably determined by the monitoring processor. This embodiment of the method is preferably continued only in the absence of a further energy source. It is likewise conceivable for this embodiment of the method to be carried out if the further energy source supplies the magnetic resonance apparatus and/or the superconducting magnet with less energy than normally required.

The inventive method is advantageous in the absence of a further energy source. This can be, for example, in the event of failure of the local power supply or a defect in a generator. In this case the magnetic resonance apparatus and its superconducting magnet can be supplied solely with energy from the energy store. According to this embodiment of the inventive method, the superconducting magnet can also be shut down in a controlled manner, and safely, in such a case, if necessary. Similarly, the second point-in-time can be determined such that the duration between the first point-in-time and the second point-in-time is as long as possible so that shutting down the superconducting magnet is not initiated immediately in the absence of a further energy source. Similarly, unnecessary shutting down of the superconducting magnet can be avoided by the energy of the energy store being used for bridging a period during which the further energy source can be restored and/or a further energy store can be connected to the magnetic resonance device and/or the superconducting magnet.

If, for example, two power failures occur within one period, in which period the energy store cannot be replaced or in which period no energy can be supplied to the energy store, the energy store can have, for example, less than 70%, in particular less than 50% of its maximum incorporable energy, and the period between the first point-in-time and the second point-in-time can be chosen to be shorter than if the energy store has the maximum incorporable energy. It can thus be ensured that in the event of a power failure, the magnetic resonance apparatus is not damaged and/or that it has to be put into operation again in a time-intensive and/or cost-intensive manner following a power failure. The magnetic resonance apparatus thus can be operated safely and reliably in regions in which power failures frequently occur.

Furthermore, a quench of the superconducting magnet can be particularly effectively prevented by the inventive method. In the case of superconducting magnets designed such that they are cooled with a particularly small quantity of cooling medium, for example with less than 100 l helium, a quench can be prevented by the inventive method, which would occur if the magnetic resonance apparatus could not be supplied with energy for longer than 6 minutes, in particular longer than 30 minutes, preferably longer than 2 hours.

In another embodiment of the method, in the absence of a further energy source, the monitoring processor is switched off following determination of the second point-in-time and a timer (serving as the aforementioned shutdown controller) triggers shutting down of the superconducting magnet. The timer can be, for example, a time detection unit, a clock, a stopwatch and/or an alarm clock. In particular, no further supply of energy to the superconducting magnet is typically necessary following initiation of shutting down at the second point-in-time. Monitoring of shutting down by the monitoring processor following the second point-in-time can be dispensed with, so that the beginning of shutting down of the superconducting magnet can also be triggered by a timer. The monitoring processor is typically connected to the timer, so that the second point-in-time determined by the monitoring processor can be transmitted to the timer. The timer can then bring about shutting down of the superconducting magnet at the second point-in-time.

An advantage of this embodiment is that the monitoring processor can be switched off at an earlier point-in-time, in particular immediately after determination of the second point-in-time, so the monitoring processor does not have to still be supplied with energy from this point-in-time. It is not necessary to supply the monitoring processor with energy from the energy store from this earlier point-in-time, so the period between the first point-in-time and the second point-in-time can be extended because the timer typically requires less energy compared to the monitoring processor.

In the absence of a further energy source, the monitoring processor can optionally be switched off point-in-timely following determination of the stored energy, and shutting down of the superconducting magnet can be triggered by the timer. This is advantageous if the stored energy matches the ramp energy, or exceeds this by a maximum of 100%, preferably by a maximum of 50%, particularly preferably by a maximum of 20%. In this case, immediate shutting down of the superconducting magnet following the first point-in-time is advantageous, so that an optimally large portion of the stored energy present at the first point-in-time can be used for shutting down the superconducting magnet. When shutting down is triggered by the timer in this case, safe and controlled shutting down of the superconducting magnet can also be ensured with a small quantity of stored energy.

In another embodiment of the method, the determination of the second point-in-time involves determining a difference in energy from a difference in the stored energy and the ramp energy. This difference in energy can match the difference in the stored energy and the ramp energy, optionally minus a further residual energy, which residual energy can be used as a buffer for safe and controlled shutting down. The period can be determined by taking into account the difference in energy and a standby power, which the magnetic resonance apparatus and/or superconducting magnet require(s) in the rest state. The second point-in-time can be determined based on the first point-in-time, plus the period. The second point-in-time thus can be determined especially accurately, and shutting down of the superconducting magnet can be controlled with a high degree of reliability.

In another embodiment of the method, in a further method step, a ramp-monitoring energy required for monitoring shutdown is determined, and determination of the second point-in-time involves determining a difference in energy from a difference in the stored energy and the ramp energy. With a difference in energy that is greater than the ramp-monitoring energy, the second point-in-time is chosen such that the energy store contains the ramp energy and ramp-monitoring energy at the second point-in-time. With a difference in energy that is less than the ramp-monitoring energy, the second point-in-time is chosen such that the energy store contains the ramp energy at the second point-in-time.

In this embodiment of the method, shutting down the superconducting magnet is monitored by the monitoring processor as a function of the stored energy. The energy required here for the monitoring processor is the ramp-monitoring energy. The ramp-monitoring energy required for monitoring shutting down is typically determined first. If monitoring of shutting down of the superconducting magnet is possible, the second point-in-time is chosen such that shutting down is monitored by the monitoring processor. If the stored energy is too low, the difference in energy is less than the ramp-monitoring energy, so monitoring of the shutting down is omitted. This embodiment makes it possible for safe shutting down of the superconducting magnet to be ensured dependent on the stored energy, and the reliability of shutting down monitoring is performed only in the cases in which it is possible. It is similarly conceivable that in cases for which the difference in energy is lower than the ramp-monitoring energy, shutting down is at least partly monitored.

Furthermore, the invention encompasses a system that includes a superconducting magnet of a magnetic resonance apparatus, a monitoring processor, and an energy store. The system is designed to carry out the inventive method for shutting down the superconducting magnet of the magnetic resonance apparatus, as described above.

For this purpose, the monitoring processor is connected to the energy store and the superconducting magnet. The energy store is designed so that the energy incorporated by the energy store is at most between 1 Wh and 10 kWh, preferably between 10 Wh and 1 kWh. The monitoring processor has an input, a processing unit and an output. The monitoring processor can be supplied via the input with functions, algorithms or parameters required in the method. The second point-in-time and/or further results of embodiments of the inventive method are supplied via the output. The monitoring processor preferably brings about and/or monitors shutting down of the superconducting magnet. The energy required for this can be supplied to the monitoring processor via the energy store. A timer can also be connected to the monitoring processor, which timer is optionally incorporated in the inventive system. The timer is then designed to trigger shutting down of the superconducting magnet.

Embodiments of the inventive system are designed analogously to the embodiments of the inventive method. The system can have further control components that are necessary and/or advantageous for carrying out the inventive method. The system can also be designed to transmit control signals and/or to receive and/or process control signals in order to carry out the inventive method. Computer programs and further software can be stored in a memory of the monitoring processor, with which the processing unit of the monitoring processor automatically controls and/or performs the process flow of the inventive method.

In an embodiment of the system, the energy store is at least one of the following components: a battery, an accumulator, a super-capacitor, a micro fuel cell, a flywheel. Components of this kind are robust, commercially available and inexpensive. Such components can be easily replaced and/or can be flexibly used. The energy store thus can be easily maintained and/or worn parts of the energy store can be easily replaced. The use of such durable components for the energy store makes the energy store robust. Controlled shutting down of the superconducting magnet thus can be continuously ensured. The above components, which can be incorporated by the energy store, are exemplary. The energy store can alternatively or additionally have other capabilities of storing and/or supplying energy.

In a further embodiment of the system, the energy store is formed by at least two energy storage units, with at least one of the multiple energy storage units is redundant. Such an energy storage unit can be one of the aforementioned components. The energy incorporated by a first energy storage unit of the at least two energy storage units is preferably sufficient for shutting down the superconducting magnet, so that a second energy storage unit of the at least two energy storage units is redundant. The life of the energy store is increased thereby, so that replacement of the energy store is required less frequently. The expenditure required for safe operation of the magnetic resonance apparatus thus can be reduced. Reliable and controlled shutting down of the superconducting magnet is nevertheless possible.

The invention also encompasses a magnetic resonance apparatus that includes the inventive system described above, so that the magnetic resonance apparatus is designed to carry out the inventive method for shutting down the superconducting magnet of the magnetic resonance apparatus. For this purpose, the magnetic resonance apparatus has all components of the inventive system. The magnetic resonance apparatus has a control computer for central control of the magnetic resonance apparatus.

The monitoring processor can be integrated in the magnetic resonance apparatus and/or in the control computer thereof. The monitoring processor can also be installed separately from the magnetic resonance apparatus and/or control computer thereof. The monitoring processor can be connected to the magnetic resonance apparatus and/or the control computer thereof. The energy store can be integrated in the magnetic resonance apparatus. The energy store can also be installed separately from the magnetic resonance apparatus. The energy store can be connected to the magnetic resonance apparatus.

Examples of electronically readable data carriers are a DVD, a magnetic tape or a USB stick, on which electronically readable control information, in particular software, is stored.

The invention also encompasses a non-transitory, computer-readable data storage medium encoded with programming instructions that, when loaded into a control computer of a magnetic resonance apparatus, or into a monitoring processor as described above, cause the control computer or monitoring processor to implement the method according to the invention, as described above.

The advantages of the inventive system, the inventive magnetic resonance apparatus, and the inventive electronically readable data carrier essentially correspond to the advantages of the inventive method for shutting down a superconducting magnet of a magnetic resonance apparatus as described above. Features, advantages or alternative embodiments mentioned in connection with the method are applicable to the other aspects of the invention as well.

DESCRIPTION OF THE PREFERRED EMBODIMENTS

Figure 1:
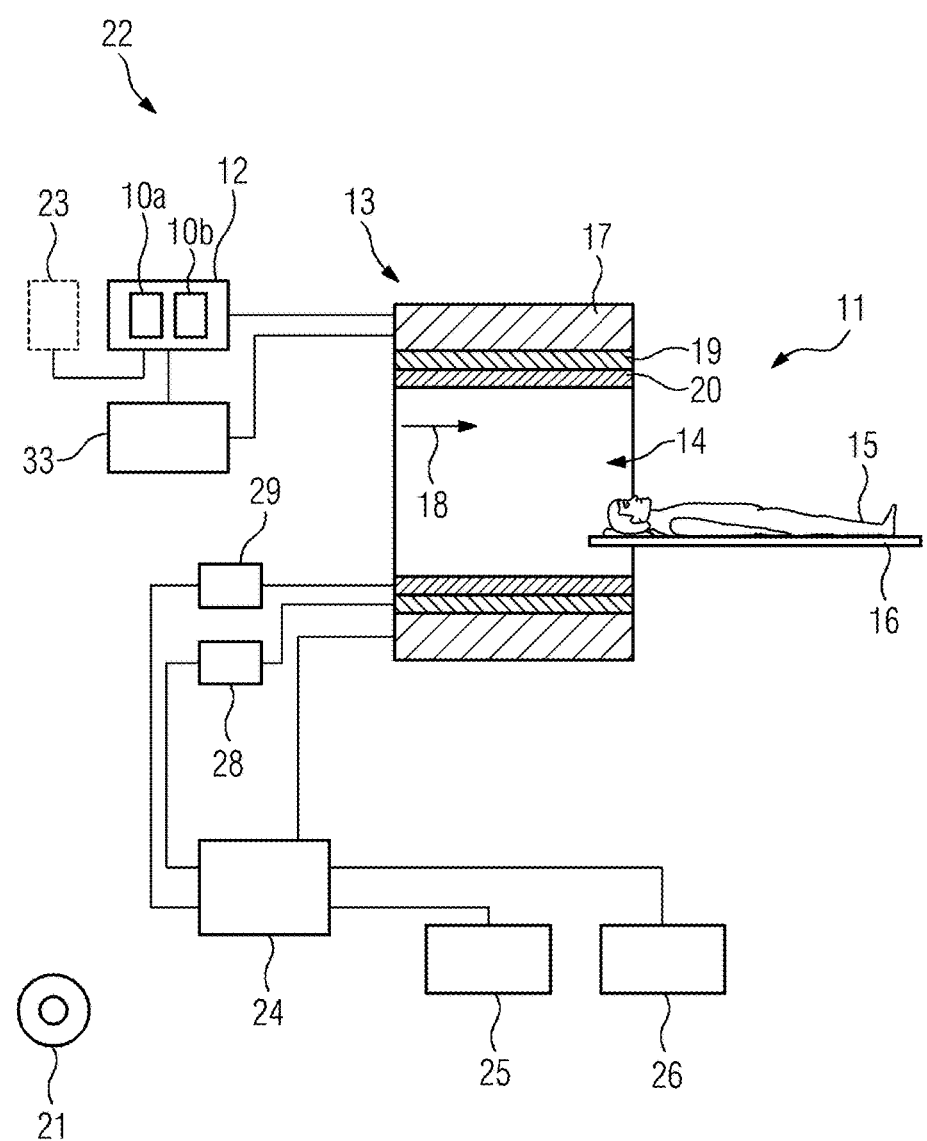
FIG. 1 schematically illustrates an inventive medical imaging apparatus.

FIG. 1 shows an inventive magnetic resonance (MR) apparatus 11 having an inventive system 22, in a schematic illustration. The system 22 as well as the magnetic resonance apparatus 11 are designed to carry out the inventive method.

The magnetic resonance apparatus 11 has an MR data acquisition scanner 13 having a superconducting magnet 17 that generates a strong and constant basic magnetic field 18. The scanner 13 has a cylindrical patient-receiving region 14 for receiving a patient 15, with the patient-receiving region 14 being cylindrically, circumferentially surrounded by the scanner 13. The patient 15 can be moved by a patient-positioning support 16 into the patient-receiving region 14. The patient-positioning support 16 for this purpose has an examination table mounted so as to move inside the scanner 13.

The scanner 13 also has a gradient coil arrangement 19 for spatially encoding the MR signals during imaging. The gradient coil arrangement 19 is controlled by a gradient controller 28. The scanner 13 also has a radio-frequency antenna 20, which in the illustrated case is designed as a body coil permanently integrated in the scanner 13, and a radio-frequency antenna controller 29 that operates the radio-frequency antenna 20 so as to radiate radio-frequency pulses into an examination space that is essentially formed by the patient-receiving region 14.

For controlling the superconducting magnet 17, the gradient controller 28 and the radio-frequency antenna controller 29, the magnetic resonance apparatus 11 has a control computer 24. The control computer 24 centrally controls the magnetic resonance apparatus 11, in order to execute MR data acquisition sequences. Furthermore, the control computer 24 has a reconstruction processor (not shown) for reconstruction of medical image data from the raw data (MR signals) acquired during the magnetic resonance examination. The magnetic resonance apparatus 11 has a display unit 25. Control information, such as control parameters, and reconstructed image data, can be displayed on the display unit 25, for example on at least one monitor, for a user. Furthermore, the magnetic resonance apparatus 11 has an input interface 26 via which a user can enter information and/or control parameters during a scanning procedure. The control computer 24 can include the gradient controller 28 and/or the radio-frequency antenna controller 29 and/or the display unit 25 and/or input interface 26.

The magnetic resonance apparatus 11 also has a monitoring processor 33 and an energy store 12. The energy store 12 has at least one of the following components: a battery, an accumulator, a super-capacitor, a micro fuel cell, a flywheel. The energy store 12 can have at least two energy storage units 10a, 10b, with at least one of the two energy storage units 10a, 10b being redundant. The magnetic resonance apparatus 11 can optionally have a timer 23. The monitoring processor 33 is designed to implement the method for shutting down a superconducting magnet of a magnetic resonance apparatus in accordance with the invention. For this purpose, the monitoring processor 33 has computer programs and/or software that can be loaded directly into a memory (not shown) of the monitoring processor 33, having program code in order to cause the inventive method for shutting down a superconducting magnet of a magnetic resonance apparatus to be implemented when the computer programs and/or software is/are run in the monitoring processor 33. The monitoring processor 33 for this purpose has processing circuitry (not shown in detail), which is designed for running the computer programs and/or software. Alternatively, the computer programs and/or software can be stored on an electronically readable data carrier (data storage medium) 21 designed separately from the control computer 24 and/or monitoring processor 33, wherein data on the electronically readable data carrier 21 can be loaded into the monitoring processor 33 and/or the control computer 24, directly or in a distributed manner.

The illustrated magnetic resonance apparatus 11 can of course have further components that magnetic resonance apparatuses conventionally have. The general mode of operation of a magnetic resonance apparatus is known to those skilled in the art, so a more detailed description is not necessary herein. The magnetic resonance apparatus 11 is designed (configured), together with the monitoring processor 33, to implement the inventive method.

The superconducting magnet 17, monitoring processor 33, energy store 12 and optional timer 23 are incorporated in the inventive system 22, which system 22 can be part of the magnetic resonance apparatus 11. The system 22 can also be installed separately from the magnetic resonance apparatus 11. The system 22 can be connected to the magnetic resonance apparatus 11. The system 22 is therefore designed (configured) to implement the inventive method.

As noted, the electronically readable data carrier 21 has electronically readable control information (program code, programming instructions) stored thereon and can be loaded into the monitoring processor 33 of the system 22 or in the monitoring processor 33 of the magnetic resonance apparatus 11.

Figure 2:
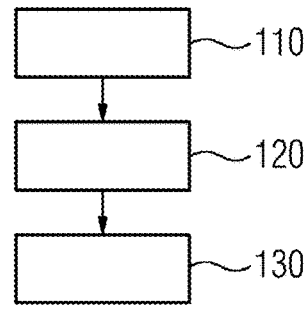
FIG. 2 is a flowchart of a first embodiment of the inventive method.

FIG. 2 is a flowchart of a first embodiment of the inventive method for shutting down the superconducting magnet 17 of a magnetic resonance apparatus 11. The method is carried out by the monitoring processor 33. At the beginning of the method, an energy stored in the energy store 12 at a first point-in-time is determined in step 110. In the following step 120, a ramp energy required for shutting down is determined, before, in step 130, a second point-in-time is determined based on the stored energy and the ramp energy at after the second point-in-time, shutting down of the superconducting magnet 17 begins. Shutting down of the superconducting magnet 17 preferably begins coincident with the occurrence of the second point-in-time.

Figure 3:
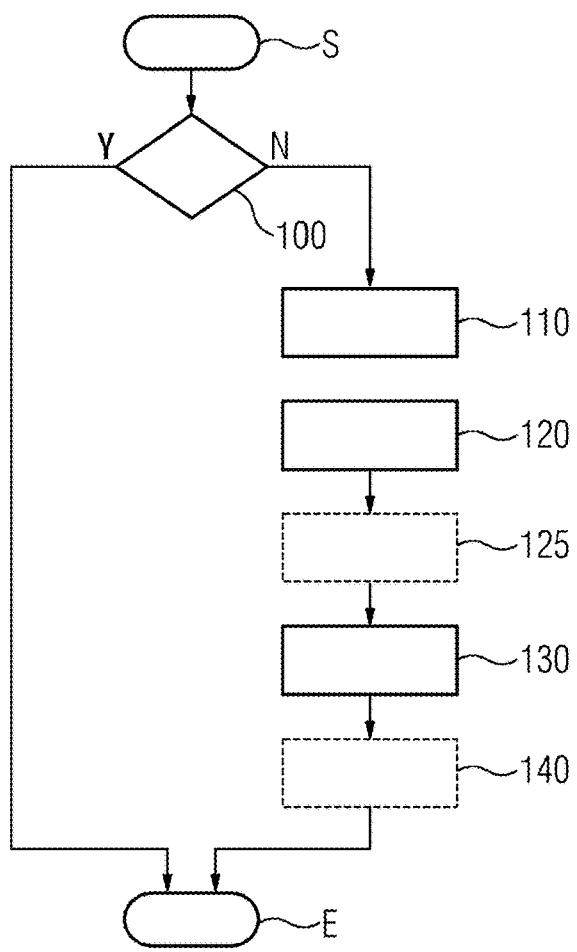
FIG. 3 is a flowchart of a second embodiment of the inventive method.

FIG. 3 is a flowchart of a second embodiment of the inventive method for shutting down the superconducting magnet 17 of the magnetic resonance apparatus 11. At the beginning of the method S, it is determined whether the superconducting magnet 17 is connected to a further energy source in addition to the energy store 12. If the decision 100 is that a further energy source is present, the method for shutting down a superconducting magnet 17 of a magnetic resonance apparatus 11 is ended prematurely, in other words step E follows, and the steps described below are not carried out. In the absence of a further energy source, the method is continued according to the following method steps.

In step 110, an amount of stored energy currently incorporated in the energy store 12 is determined at a first point-in-time. A ramp energy required for shutting down is determined in the following step 120. A ramp-monitoring energy required for monitoring the shutting down is optionally determined in an additional step 125. The steps 110, 120 and 125 can be carried out independently of each other time-wise and/or at least partially overlapping.

In step 130, a second point-in-time is determined based on the stored energy and the ramp energy, at which second point-in-time shutting down of the superconducting magnet 17 is begun. A difference in energy can be formed from a difference in the stored energy and the ramp energy. If the ramp-monitoring energy was determined in step 125, then in step 130, with a difference in energy that is greater than the ramp-monitoring energy, the second point-in-time is chosen such that the energy store 12 includes the ramp energy and the ramp-monitoring energy at the second point-in-time. If, by contrast, the difference in energy is less than the ramp-monitoring energy, the second point-in-time is chosen in step 130 such that the energy store 12 includes the ramp energy at the second point-in-time.

Shutting down of the superconducting magnet 17 optionally begins with the occurrence of the second point-in-time in step 140. The monitoring processor 33 can also be switched off in the absence of a further energy source after determination of the second point-in-time, in other words after step 130, and the timer 23 then triggers shutting down of the superconducting magnet 17, in other words step 140. Alternatively, in the absence of a further energy source, the monitoring processor 33 can be switched off point-in-timely after step 100, and shutting down of the superconducting magnet 17 is then triggered by the timer 23.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for shutting down a superconducting magnet of a magnetic resonance apparatus, comprising:

with a monitoring processor, determining an amount of stored energy stored in an energy store at a first point-in-time;

in said monitoring processor, determining a ramp energy that is required for shutting down said superconducting magnet;

in said monitoring processor, determining a second point-in-time based the determined amount of stored energy and the ramp energy; and using a shutdown controller to begin shutting down said superconducting magnet at said second point-in-time, using said energy stored in said energy store.

2. A method as claimed in claim 1 comprising using said monitoring processor as said shutdown controller.

3. A method as claimed in claim 1 comprising, before beginning shutting down of said superconducting magnet, determining, in said monitoring processor, whether the superconducting magnet is connected to a further energy source, other than said energy store, and implementing shutting down of said superconducting magnet using energy stored in said energy store only in an absence of a further energy source.

4. A method as claimed in claim 2 comprising, in an absence of a further energy source, switching off said monitoring processor after determining said second point-in-time, and using a timer, as said shutdown controller, to trigger shutting down of said superconducting magnetic.

5. A method as claimed in claim 1 comprising determining said second point-in-time by determining a difference in energy between said stored energy in said energy store and said ramp energy.

6. A method as claimed in claim 1 comprising:

in said monitoring processor, determining a ramp-monitoring energy required for monitoring said shutting down of said superconducting magnetic, and determining said second point-in-time dependent on a difference between said determined amount of said stored energy and the ramp energy;

if said difference is larger than said ramp-monitoring energy, determining said second point-in-time so that, at said second point-in-time, said energy store contains said ramp energy and said ramp-monitoring energy; and if said difference is smaller than said ramp-monitoring energy, determining said second point-in-time so that, at said second point-in-time, said energy store contains said ramp energy.

7. A system for shutting down a superconducting magnetic of a magnetic resonance apparatus, said system comprising:

an energy store in which energy is stored;

a monitoring processor configured to determine an amount of stored energy stored in said energy store at a first point-in-time;

said monitoring processor being configured to determine a ramp energy that is required for shutting down said superconducting magnet;

said monitoring processor being configured to determine a second point-in-time based the determined amount of stored energy and the ramp energy; and using a shutdown controller configured to begin shutting down said superconducting magnet at said second point-in-time, using said energy stored in said energy store.

8. A system as claimed in claim 7 wherein said shutdown controller is said monitoring processor.

9. A system as claimed in claim 7 wherein said energy store comprises at least one of a battery, an accumulator, a super-capacitor, a micro-fuel cell, or a flywheel.

10. A system as claimed in claim 7 wherein said energy store comprises at least two energy storage units, wherein at least one of said at least two energy storage units is redundant with respect to other storage units among said at least two storage units.

11. A magnetic resonance apparatus comprising:

a superconducting magnetic;

an energy store in which energy is stored;

a monitoring processor configured to determine an amount of stored energy stored in said energy store at a first point-in-time;

said monitoring processor being configured to determine a ramp energy that is required for shutting down said superconducting magnet;

said monitoring processor being configured to determine a second point-in-time based the determined amount of stored energy and the ramp energy; and using a shutdown controller configured to begin shutting down said superconducting magnet at said second point-in-time, using said energy stored in said energy store.

12. A non-transitory, computer-readable data storage medium encoded with programming instructions, said storage medium being loaded into a computer that is a component of, or is connected to, a magnetic resonance apparatus that comprises a superconducting magnetic and an energy store in which energy is stored, said programming instructions causing said computer to:

determine an amount of stored energy stored in an energy store at a first point-in-time;

determine a ramp energy that is required for shutting down said superconducting magnet;

determine a second point-in-time based the determined amount of stored energy and the ramp energy; and begin shutting down said superconducting magnet at said second point-in-time, using said energy stored in said energy store.

* * * * *